(12) United States Patent
Zhang et al.

(10) Patent No.: US 8,025,829 B2
(45) Date of Patent: Sep. 27, 2011

(54) DIE IMPRINT BY DOUBLE SIDE FORCE-BALANCED PRESS FOR STEP-AND-REPEAT IMPRINT LITHOGRAPHY

(75) Inventors: Wei Zhang, Plainsboro, NJ (US); Hua Tan, Princeton Junction, NJ (US); Lin Hu, Livingston, NJ (US); Stephen Y. Chou, Princeton, NJ (US)

(73) Assignee: Nanonex Corporation, Monmouth Junction, NJ (US)

( * ) Notice: Subject to any disclaimer, the term of this patent is extended or adjusted under 35 U.S.C. 154(b) by 0 days.

(21) Appl. No.: 11/945,407

(22) Filed: Nov. 27, 2007

(65) Prior Publication Data
US 2008/0122138 A1 May 29, 2008

Related U.S. Application Data

(60) Provisional application No. 60/867,511, filed on Nov. 28, 2006, provisional application No. 60/869,979, filed on Dec. 14, 2006.

(51) Int. Cl.
*B29C 59/02* (2006.01)
(52) U.S. Cl. ......... 264/293; 264/294; 264/319; 977/887
(58) Field of Classification Search ................... 264/1.1, 264/1.33, 293, 319, 494, 294; 977/887
See application file for complete search history.

(56) References Cited

U.S. PATENT DOCUMENTS

| | | | | |
|---|---|---|---|---|
| 3,830,681 | A * | 8/1974 | Wilson | 156/583.2 |
| 6,696,099 | B2 * | 2/2004 | Ro | 427/209 |
| 6,900,881 | B2 * | 5/2005 | Sreenivasan et al. | 355/72 |
| 2006/0273488 | A1 * | 12/2006 | Seki et al. | 264/293 |
| 2006/0292463 | A1 * | 12/2006 | Best et al. | 430/22 |

\* cited by examiner

*Primary Examiner* — Katarzyna Wyrozebski Lee
*Assistant Examiner* — Scott W Dodds
(74) *Attorney, Agent, or Firm* — Polster, Lieder, Woodruff & Lucchesi, LC

(57) ABSTRACT

In accordance with the invention, step-and-repeat imprint lithography is effected by applying balanced pressing forces from both sides of a substrate. The pressing forces are substantially equal in amplitude and opposite in direction. With the pressing forces thus balanced, the fixture that steps and holds the substrate does not bear the load of imprinting. The balance allows use of a high resolution aligning stage to carry the substrate and to maintain high accuracy of positioning without being shifted by change of load. With this method, sufficient imprint pressure can be used to obtain high quality patterning, a thin and uniform residual layer, and a high fidelity pattern.

7 Claims, 19 Drawing Sheets

A — Provide mold and substrate with a moldable layer

B — Press mold and substrate – pushing surface replication feature into moldable layer C — Separate substrate off mold

DIE IMPRINT BY DOUBLE SIDE FORCE-BALANCED PRESS FOR STEP-AND-REPEAT IMPRINT LITHOGRAPHY

CROSS-REFERENCE TO RELATED APPLICATIONS

This application claims the benefit of U.S. Provisional application Ser. No. 60/867,511 of the same title filed by Wei Zhang, et al. on Nov. 28, 2006. It also claims the benefit of U.S. Provisional application Ser. No. 60/869,979 filed Dec. 14, 2006. Both Provisional applications are incorporated herein by reference.

STATEMENT REGARDING FEDERALLY SPONSORED RESEARCH

Not Applicable.

FIELD OF INVENTION

This invention relates to methods and apparatus for imprint lithography. It is particularly useful for providing step-and-repeat imprint replication of patterns having microscale or nanoscale features.

BACKGROUND OF THE INVENTION

Lithography is a key process in the fabrication of semiconductor integrated circuits and many optical, magnetic, biological, and micromechanical devices. Lithography creates a pattern on a substrate-supported moldable surface so that in subsequent process steps, the pattern can be replicated in the substrate or in another material that is added onto the substrate.

Conventional lithography, referred to as optical lithography, involves applying a thin film of photosensitive resist onto a substrate, exposing the resist to a desired pattern of radiation and developing the exposed resist to produce a physical pattern on the substrate. Unfortunately, the resolution of patterns produced by optical lithography is limited by the wavelength of the exposing radiation. Moreover, as pattern features become smaller, increasingly expensive shorter wavelength equipment is required.

A major use of optical lithography is step-and-repeat lithography in the fabrication of integrated circuits. Step-and-repeat lithography replicates patterns much smaller than the substrate. Typically a patterned area, called a die, is replicated many times and can cover most of the area of the substrate. A typical die is about one inch square, and a typical substrate is an 8 or 12 inch diameter wafer. Step-and-repeat optical lithography exposes a first die on the substrate, moves the substrate to a new position for a new exposure of the next die and repeats the process many times.

Imprint lithography, based on a fundamentally different principle, is a promising technology to replace optical lithography. In imprint lithography a mold with a pattern of projecting and recessed features is pressed into a moldable surface on a substrate (typically a thin polymer film), and imprints into the film the features of the mold. After the mold is removed, the thin film can be further processed, as by removing the residual reduced thickness portions of the film to expose the underlying substrate. As compared to optical lithography, imprint lithography offers substantial advantages of high resolution, low cost and large area coverage.

A potential limitation on manufacturing using step-and-repeat imprint lithography is inferior imprinting quality and low throughput caused by the sensitivity of the step-and-repeat apparatus to pressure. The high resolution alignment stages used to step the substrate cannot take the optimal load needed for quality imprinting. As a consequence, step-and-repeat imprint lithography has been limited to low imprinting pressure of about 0.1 psi. As a result, the quality of step-and-repeat imprint patterns has been dramatically reduced. Conventional step-and-repeat imprint lithography leaves a thick residual layer having large thickness variations, provides low patterning fidelity and achieves only low throughput. Accordingly there is a need for improved methods and apparatus for step-and-repeat imprint lithography.

BRIEF SUMMARY OF THE INVENTION

In accordance with the invention, step-and-repeat imprint lithography is effected by applying balanced pressing forces from both sides of a substrate. The pressing forces are substantially equal in amplitude and opposite in direction. With the pressing forces thus balanced, the fixture that steps and holds the substrate does not bear the load of imprinting. The balance allows use of a high resolution aligning stage to carry the substrate and to maintain high accuracy of positioning without being shifted by change of load. With this method, sufficient imprint pressure can be used to obtain high quality patterning, a thin and uniform residual layer, and a high fidelity pattern.

BRIEF DESCRIPTION OF THE DRAWINGS

The features, nature and advantages of the invention will be more clearly understood by consideration of the illustrative embodiments now to be described in detail in connection with the accompanying drawing. In the drawing.

It is to be understood that these drawings are for purposes of illustrating the concepts of the invention and are not to scale.

DETAILED DESCRIPTION OF THE INVENTION

Imprint lithography is a developing technology for patterning microscale and nanoscale features required for various devices. Depending on the polymer used, imprint lithography may be divided into thermal imprint lithography and UV (ultraviolet light) imprint lithography. Thermal imprint lithography uses thermal plastic polymer or thermal curable polymer as resist. UV imprint lithography uses UV curable polymer as resist. Thermal and UV imprint lithography are similar in process except for the steps taken to make the polymer flowable and to harden the imprinted polymer.

Figure 1:
FIG. 1 is a flow chart to show conventional imprint lithography.
Figure 1:

Referring to FIG. 1, an initial step in imprint lithography is to provide a substrate having a moldable surface and a mold having an imprintable pattern. Typically the moldable surface is a thin moldable polymer film applied on the substrate, as by spinning, dropping or deposition. The mold has a molding surface with topological surface variations that replicate a pattern into the moldable polymer by imprinting. The mold typically includes an anti-sticking layer coated on the patterned mold surface to facilitate release from the moldable surface.

In the next step, the mold and the substrate are pressed against each other. The surface replication features on the mold are pushed into the moldable polymer on the substrate. For thermal plastic polymer, it is required to heat the polymer above its glass transition temperature so that it will flow. Thermally curable polymers and UV curable polymers in contrast are typically deformable without heating.

When the surface replication features are completely pushed into moldable polymer layer, the polymer is at least partially hardened to retain the imprinted pattern. Thermal plastic polymer is hardened by cooling the polymer below its glass transition temperature. Thermally curable polymer is hardened by heating the polymer to its setting temperature; and UV curable polymer is hardened by UV radiation to initiate molecular cross-linking.

The third step is to separate the substrate from the mold. After separation, the hardened moldable layer stays on the substrate and retains the imprinted pattern.

Further post-imprinting processing may remove the residual layer underneath recessed areas of the replicated features. Such removal can expose the underlying substrate for patterned etching, coating or doping.

Step-and-repeat imprint lithography involves repeatedly imprinting the same pattern ("die") on a substrate at many locations. Most of the moldable area of a substrate may be covered by many imprintations of the same die at different locations.

Figure 2:
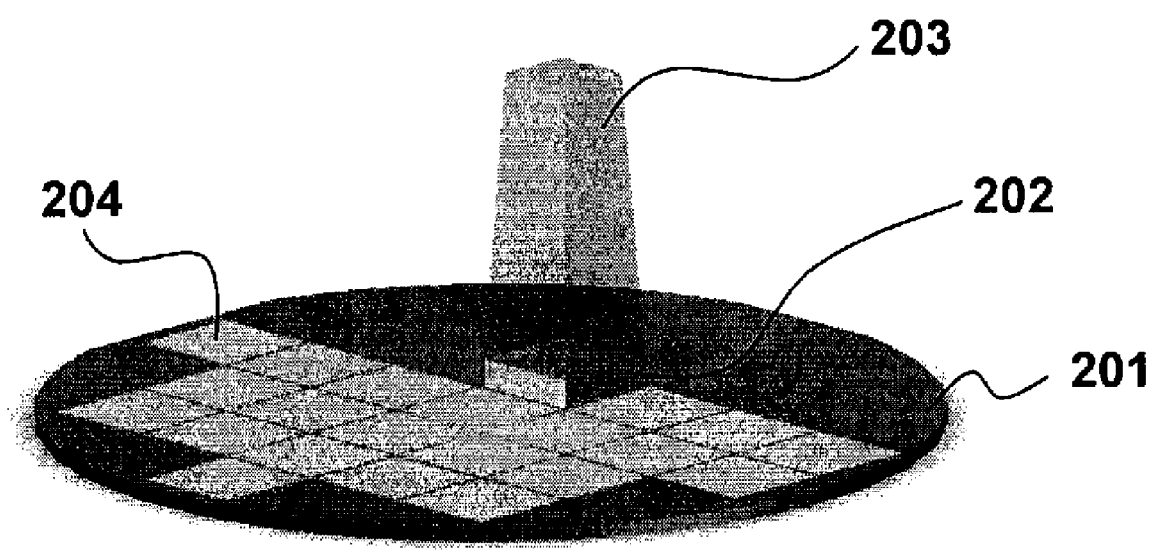
FIG. 2 schematically illustrates conventional step-and-repeat imprint lithography.

FIG. 2 illustrates step-and-repeat imprint lithography. Substrate 201 is larger than mold 202. Many imprints of mold 202 are performed sequentially to pattern most of the moldable areas of the substrate. Each imprint produces a pattern of replication features of mold 202. The pattern of each imprint is a "die" 204. The polymer die can be hardened by UV radiation exposure 204. By repeated imprinting, substrate 201 can be covered with a repeated pattern of dies. While thermal imprint lithography can alternatively be used, UV-imprint lithography is more popular for step-and-repeat imprint lithography because the UV curing of one die does not affect previously imprinted adjacent dies.

Step-and-repeat imprint lithography is potentially a very important tool for integrated circuit manufacturing. It provides a way to duplicate the pattern of a small area mold to cover a large area substrate. It also provides a way of using a small area mold to make a large area mold composed of many copies of the small area mold.

Unfortunately, conventional step-and-repeat imprint apparatus requires very low-load pressing. During imprinting of each die, only a very small pressure (<1 psi) is applied on the mold to perform imprinting. The reason for such low pressure is that the high resolution alignment stages can not operate properly with any significant load. However, such low pressure is insufficient to form a good imprinted pattern and requires the use of ultra-flat substrates.

To overcome the drawbacks of conventional step-and-repeat imprint lithography, applicants employ a double side, force-balanced press to press the mold against the substrate. The force-balanced pressing imposes no significant load of imprinting pressure onto the alignment stages that hold the substrate. Therefore, the method allows the use of higher pressure to achieve high quality imprinting and produces a thin, uniform residual layer and a high fidelity pattern.

The basic idea of double side, force-balanced pressing is to apply balanced pressing forces from opposite sides of the substrate. The pressing forces are substantially equal in amplitude and opposite in direction. Thus the fixture that holds the substrate does not bear a load from the imprinting. This low net load allows the high resolution aligning stage carrying the substrate holder to maintain high accuracy of positioning without being shifted by change of load. Sufficient pressure of imprinting can be applied to obtain high quality patterning without destroying precise alignment.

Figure 3:
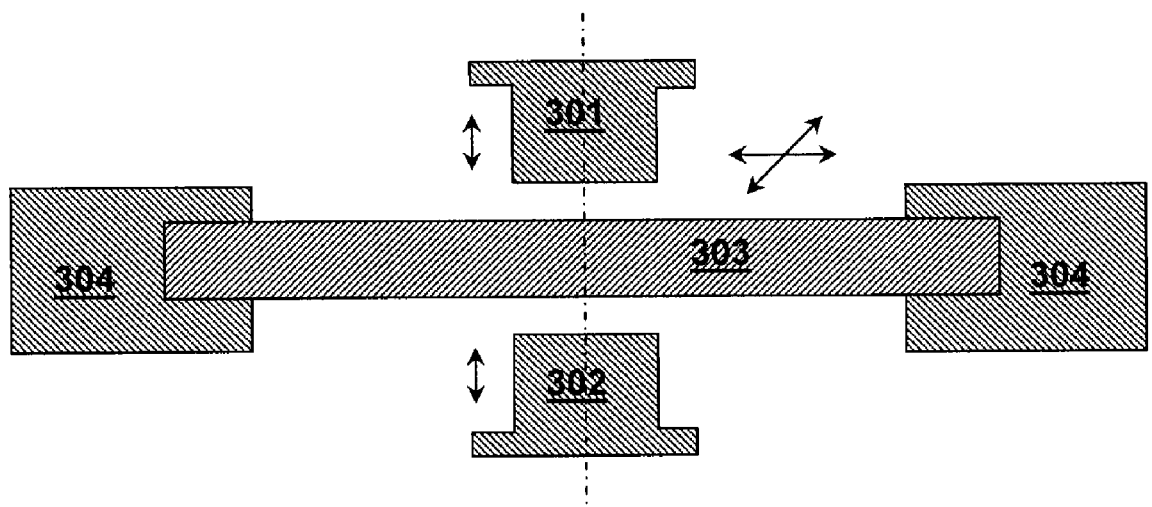
FIG. 3 illustrates apparatus of the invention.

FIG. 3 illustrates apparatus for practicing the method. Substrate 303 is held by fixture 304. Fixture 304 holds the substrate at edge areas and can be hollow. Most of the area of substrate 303 is accessible from both sides of the substrate. Substrate 303 extends between the two bodies 301 and 302. The surfaces of bodies 301 and 302 facing the substrate directly are approximately parallel to the major surface of the substrate. The bodies can contact the substrate surfaces by moving or expanding. The bodies can also apply force against the surfaces of the substrate. The two bodies are positioned so that they apply force to the substrate aligned along a common axis. The axis passes through the center of the area to be imprinted and is perpendicular to surface of the substrate. The substrate together with its fixture can move in the lateral plane relative to the bodies. The bodies can individually move along a transverse axis perpendicular to the lateral plane to get closer to or farther away from the substrate surface. One body can have a mold for imprinting attached to its surface facing the substrate for single side imprinting. Two bodies can both have molds for imprinting attached to their surfaces facing sides of the substrate for double side imprinting.

Figure 4:
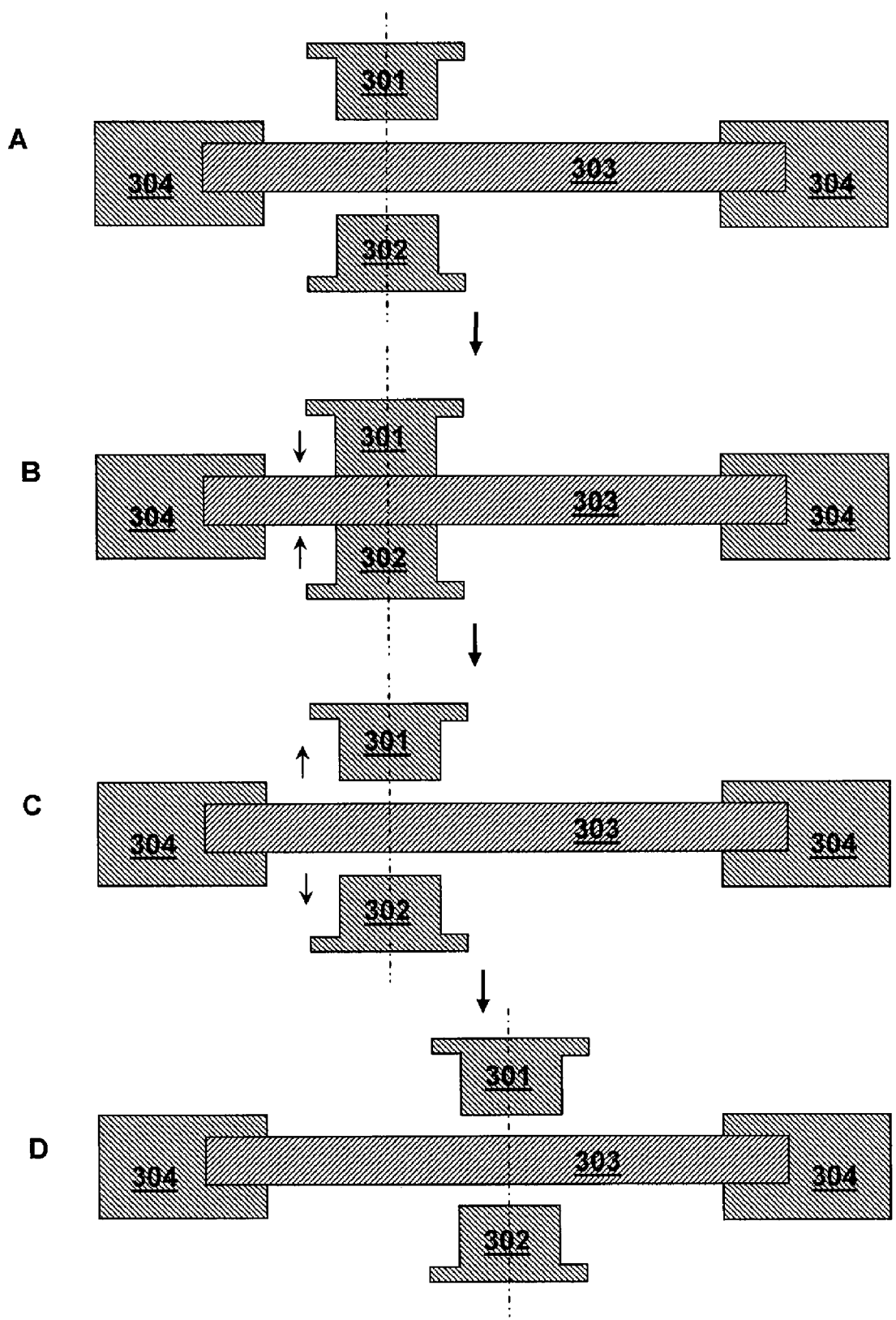
FIGS. 4A through 4D illustrate a first example of imprint lithography in accordance with the invention.

FIG. 4 illustrates the apparatus performing step-and-repeat imprint lithography. In FIG. 4A two bodies 301 and 302 are co-axially positioned to face a die area on substrate 303. Referring to FIG. 4B, when die pressing is started, the two bodies 301 and 302 are moved transversely into contact with the surfaces of substrate 303. The bodies are pressed against the substrate at well-controlled balanced magnitude and timing to prevent undesired substrate bending. At the end of the ramping up of force, the forces against both sides of the substrate should be equal in amplitude and opposite in direction. Thus, no substantial unbalanced force is taken by fixture 304 or its connected parts.

For imprint lithography, the mold imprints into a moldable surface such as a polymer layer pre-applied on substrate. The moldable surface could be on either side of the substrate or on both sides. After pressing, the forces are released from each body at well-controlled balanced magnitude and timing until no force is applied. Referring to FIG. 4C, the two bodies 301 and 302 are moved to break off contact with the substrate. Substrate 303 is then free to move. As shown in FIG. 4D, relative lateral movement between the two bodies and the substrate is then effected so that the common axis of the two bodies passes to a new location on the substrate where the next die is to be imprinted. The relative movement may be achieved by moving either the substrate or the bodies. After the relative movement, a new die is imprinted in the same fashion. By repeating this process, step-and-repeat imprint lithography may be performed to produce repeated multiple dies on a substrate.

Figure 5:
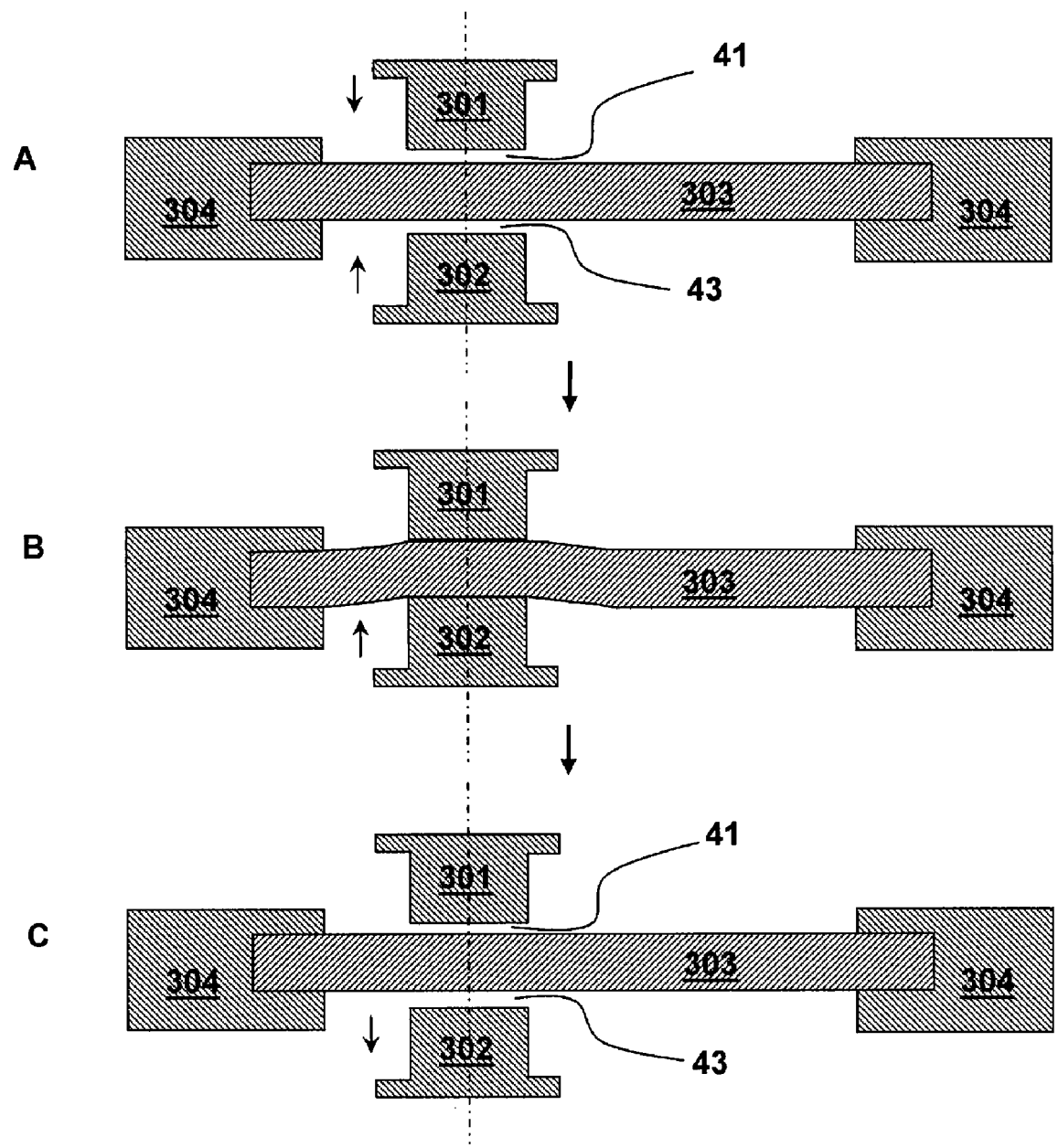
FIGS. 5A through 5C illustrate an alternative method of pressing.

FIG. 5 illustrates an alternative process where the pressing of FIG. 4B is replaced by three steps. In FIG. 5A, die pressing begins by disposing bodies 301 and 302 close to substrate 303 to predetermined gaps 41 and 42. Referring to Block B2 of FIG. 4B, body 302 moves to contact with substrate 303, then, pushes the substrate to bend into contact with body 301. Then the die-imprint press is performed by further increasing the pushing force. Body 301 is holding its position during the press. The moldable surface on the substrate can be either the substrate surface facing body 301, the surface facing body 302, or both. As shown in FIG. 5C, after the moldable surface is consolidated, body 302 retracts to release the pressing force and the substrate returns to its original shape. The alternative process then continues the remaining steps of FIG. 4. Alternatively, it can be that body 301 moves down to push and body 302 is fixed. In the process, gap 41 determines how much the substrate is locally bent at die area. The gap is predetermined according to substrate material, thickness, molding patterns, and moldable surface. The gap should be chosen to avoid cracking the substrate, to press uniformly over die area, and to separate easily from moldable surface. Normally, the gap chosen should demand much less substrate bending force than the desired die-imprint press force. The press forces applied by the two bodies are approximately equal to each other when the substrate bending force is small. The process is a single-side press that achieves double side force-balanced press under assistance of bending the substrate in a predetermined manner.

Figure 6:
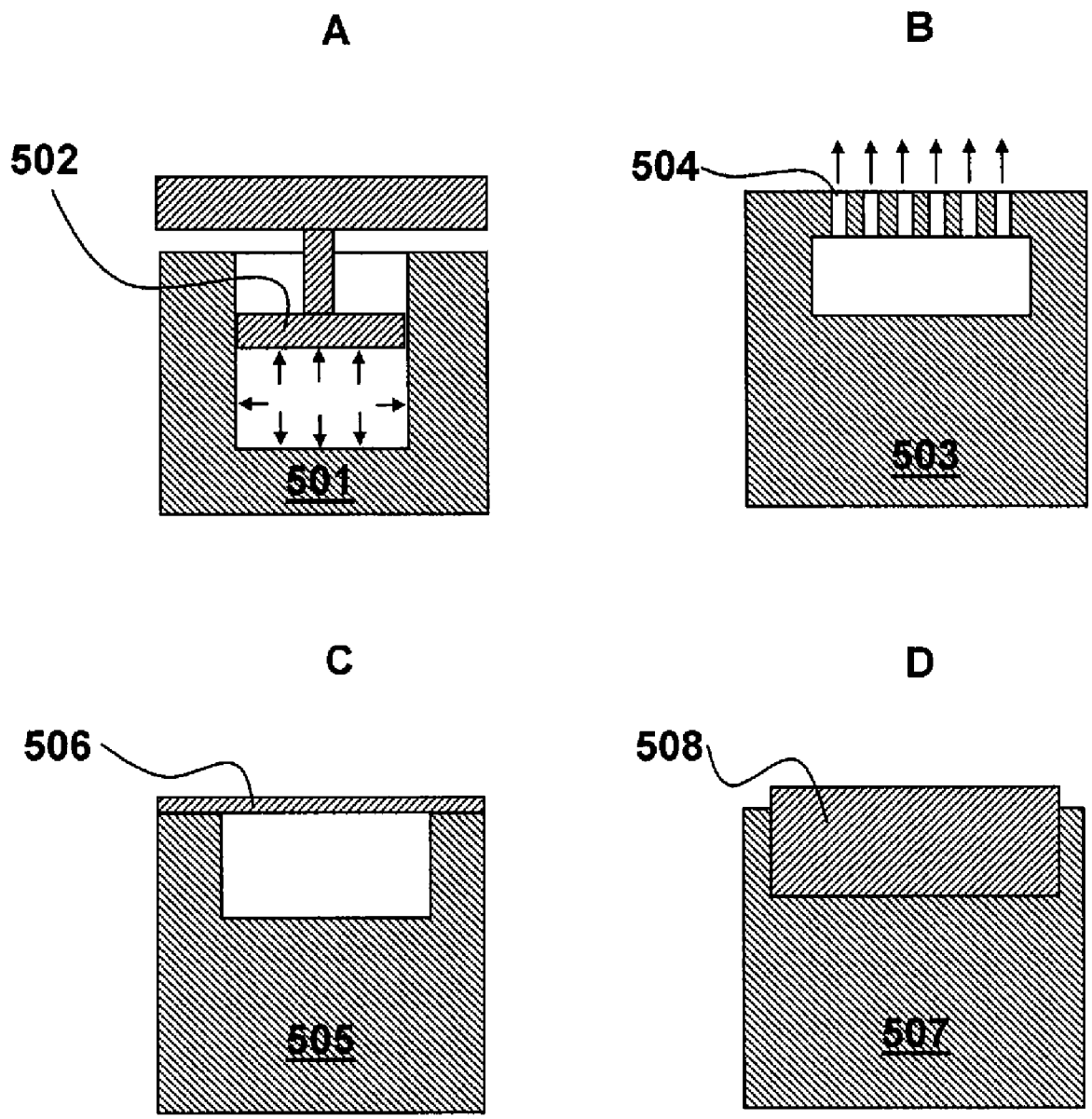
FIGS. 6A through 6D show several ways to apply pressing force in the method of FIG. 4.

FIG. 6 shows several ways for applying pressing force by the bodies 301, 302. Referring to FIG. 6A, pressing unit 501 uses a hydraulic piston 502 to apply urging force. Piston 502 is moved up and down by hydraulic pressure inside a cavity. In FIG. 6B, pressing unit 503 uses blowing gas to apply pressing force. Jets of gas blow through openings 504 at the end of a cavity. FIG. 6C illustrates a pressing unit 505 that uses an inflatable sealed membrane 506 to apply pressing force. Membrane 506 can be inflated by gas pressure built up inside a cavity. The FIG. 6D pressing unit 507 uses a piezo actuator 508 to apply the pressing force. Piezo actuator 508, controlled by high voltage applied on its two ends, is embedded into a body of the pressing unit. The pressing unit may use any one of the above ways or any combination thereof.

Figure 7:
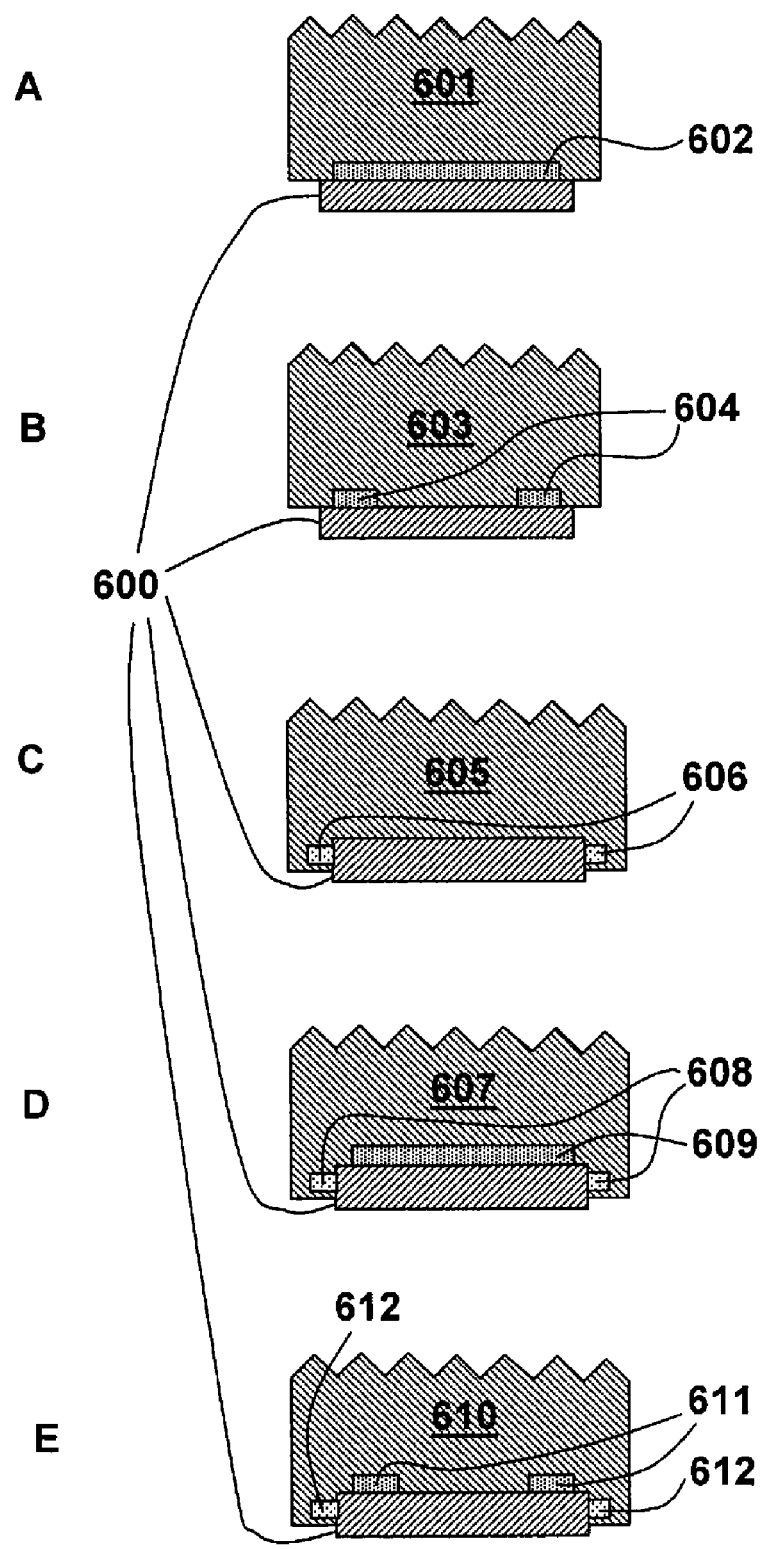
FIGS. 7A through 7E show several ways to attach the mold onto a pressing unit.

As shown in FIG. 7, the mold can be fixed on a pressing unit by one or more of several ways, such as vacuuming, gluing, or clamping. In pressing unit 601 of FIG. 7A, the mold 600 can be attached by vacuum or by gluing at area 602. FIG. 7B unit 603 comprises a mold 600 attached by vacuum or gluing at edge areas 604. In FIG. 7C, unit 605 comprises a mold 600 attached by clamps 606 at the sides. FIG. 7D unit 607 comprises a mold 600 attached by a combination of vacuum or gluing at area 609 and clamping 608 at sides of the mold. And the FIG. 7E unit 610 comprises a mold 600 attached by a combination of vacuum or gluing at edge areas 611 and clamping 612 at the sides.

Figure 8:
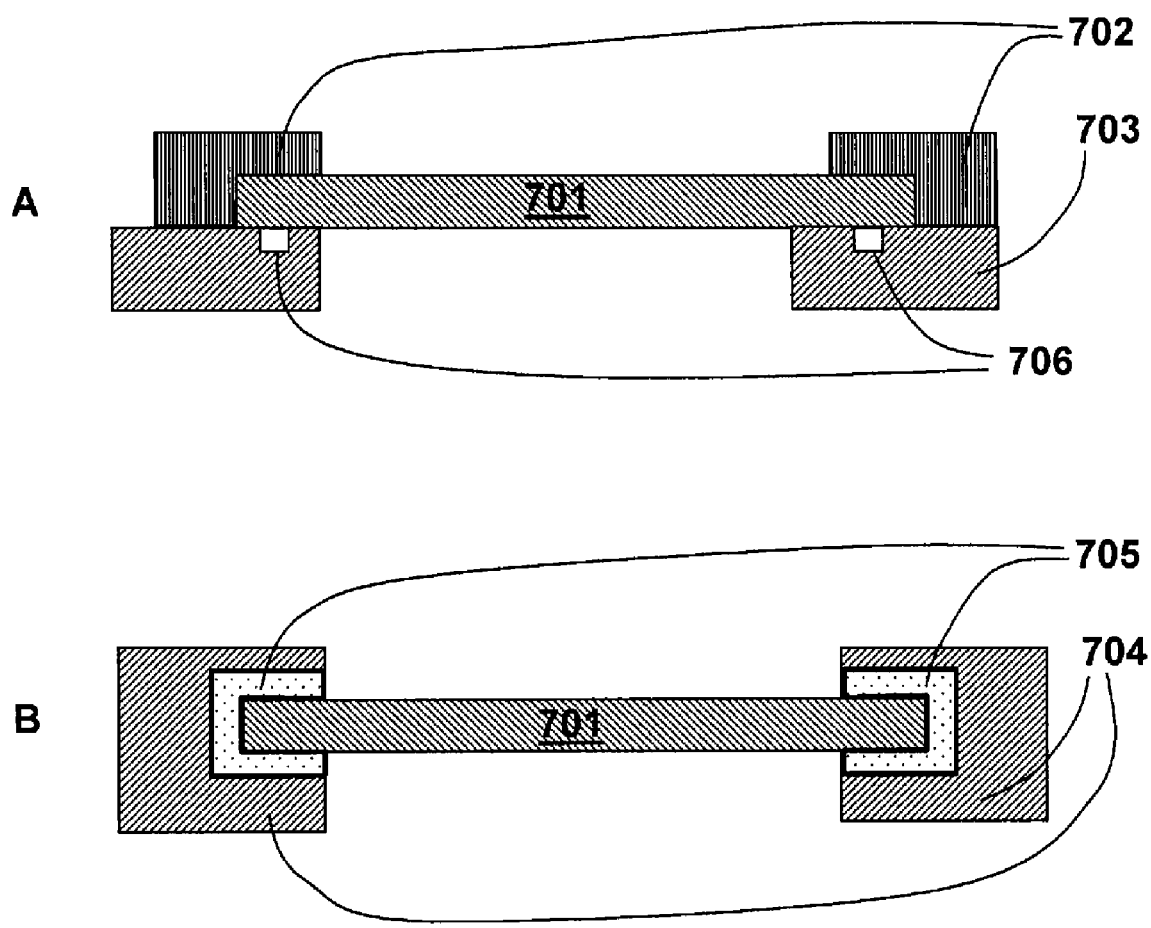
FIGS. 8A and 8B illustrate ways to hold a substrate onto a fixture.

FIG. 8A shows a substrate 701 held on the fixture by mechanical clamps 702 and inflatable sealed capsules 705. The mechanical clamps 702 hold the edge of the substrate against the base plate 703 of the fixture. To protect the substrate, a soft cushion may be applied on the contact surfaces of clamps 702 and base plate 703. Vacuum groove 706 underneath the holding area provides additional holding force by fluid suction.

In FIG. 8B, an inflatable sealed membrane capsule 705 is embedded into body plate 704 of the fixture. When pressurized gas is flowed into sealed capsule 705, the membrane of the capsule is inflated to hold the edge of the substrate from both sides. Increasing the pressure inside the capsule can apply strong holding force on the edge of the substrate. When the gas inside the capsule is released, the substrate can be unloaded from the fixture and a new substrate can be loaded. The holding by capsule has advantages of tunable holding force and soft contact to the substrate. Mechanical clamps and inflated membranes or capsules can also be combined to apply the holding force. Vacuum suction underneath the holding areas may be implemented to assist holding the substrate.

Figure 9:
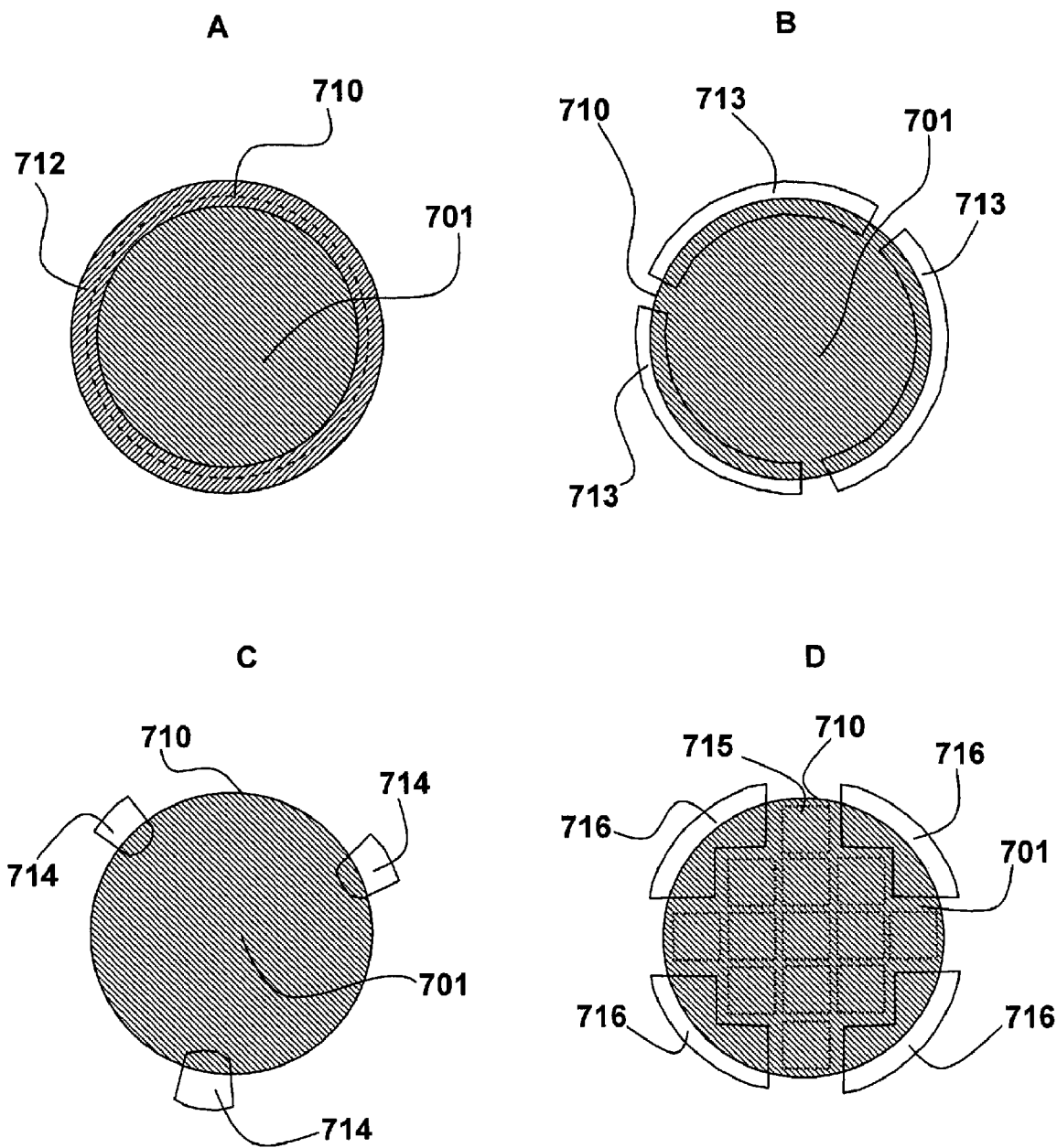
FIGS. 9A through 9D show various configurations for holding the substrate.

FIG. 9 illustrates horizontal views of the holding arrangements of the fixture. The arrangement of the holding areas should hold the substrate during die imprinting, while permitting die-imprinting as close as possible to the edge of the substrate. Referring to FIG. 9A, a holding ring 712 is used to uniformly hold peripheral 710 of substrate 701, in FIG. 9B, a plurality of arc-shape rings 713, (preferably three rings) are used to hold most of the periphery 710 of substrate 701. In FIG. 9C, round-corner-shape pads 714, (preferably three pads) are used to hold corresponding areas of the periphery 710 of substrate 701. Referring to FIG. 9D, a plurality of zigzag-shape pads 716 hold corresponding areas of periphery 710 of substrate 701. The zigzag shape follows a predetermined arrangement of multi dies 715 on the substrate in order to optimally utilize the available edge areas for holding the substrate. As shown in the drawing, four zigzag-shape pads to hold four corners of the substrate are preferable.

Figure 10:
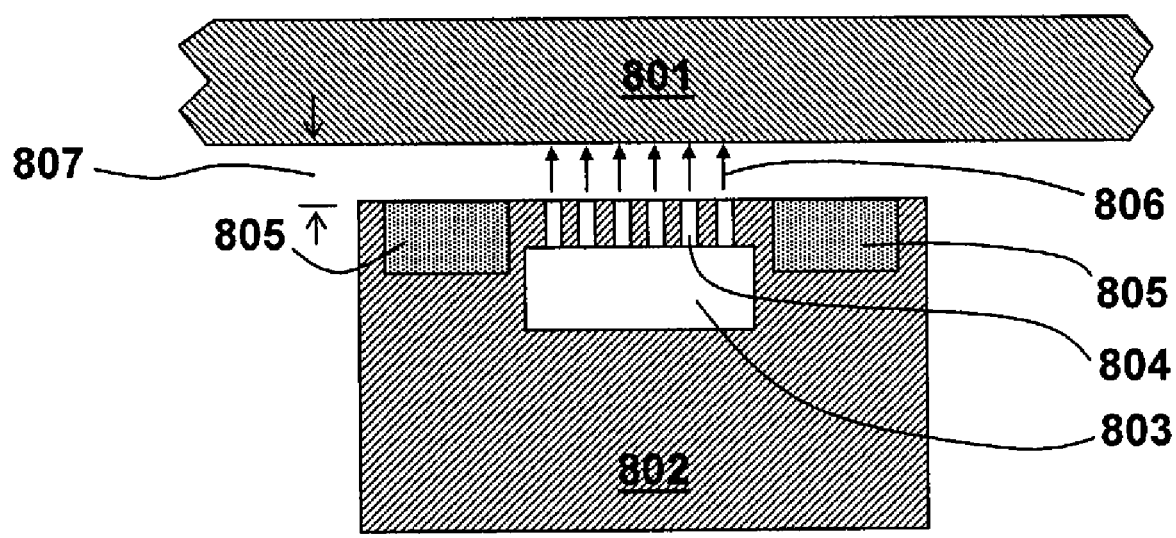
FIG. 10 shows an exemplary pressing unit.

FIG. 10 illustrates an exemplary pressing unit that uses blowing gas to imprint and uses vacuum to hold the attached mold and/or control the area of pressing. Pressing unit 802 has a cavity 803, flow channels 804 and a vacuum area 805 surrounding the flow channel. Substrate 801 is positioned close to the flow channel surface. The substrate and the surface are separated by a gap 807. Gap 807 is advantageously monitored and adjustable. Gap 807 has an empirically determinable optimum value for the best performance of the pressing unit. When no mold is attached to pressing unit 802, pressurized gas is blown into cavity 803. Jets 806 of high speed gas flow from the flowing channel. When the jets hit surface of substrate, they press on it. Vacuum area 805 can pump out diffused gas to create a lower pressure region. This will define an effective area of pressing by gas blowing. When a mold is attached to the pressing unit, vacuum area 805 holds the mold against surface of the pressing unit. When pressurized gas is flowed into cavity 803, vacuuming area 805, can either 1) hold the mold against the surface of the pressing unit, or 2) allow the mold off the surface of the pressing unit. In the first case, gas pressure built up at blowing area applies pressure against mold for imprinting. In the second case, blowing gas applies pressure against mold for imprinting and vacuum area 805 defines the effective area of pressing. The gap control system may be either part of the pressing unit or be independent from the pressing unit.

Figure 11:
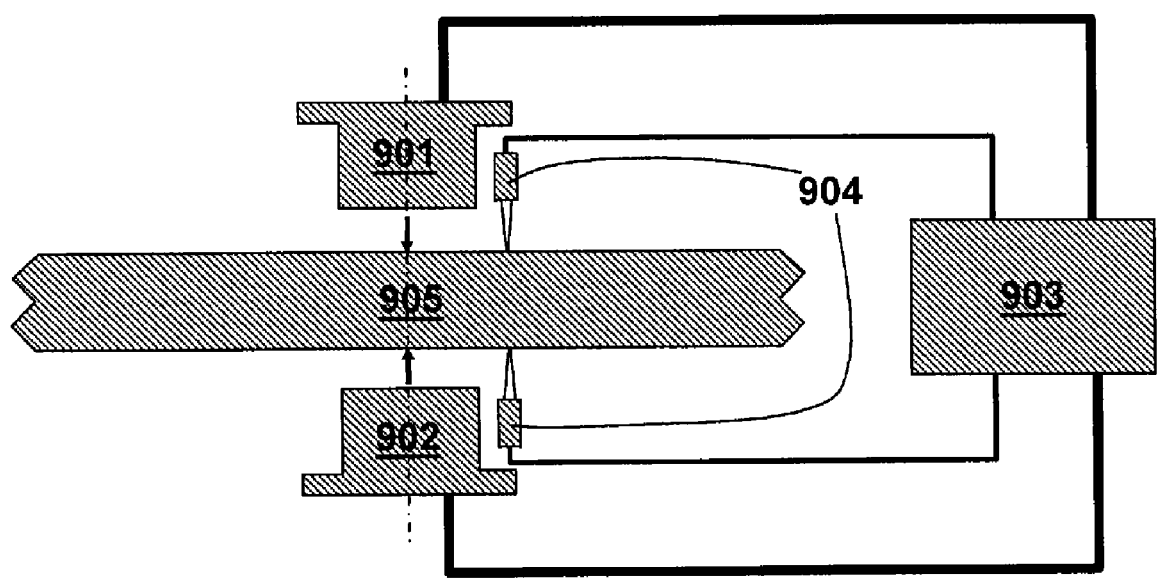
FIG. 11 illustrates a gap control system.

The method of the invention can include the use of a gap control system to dynamically adjust substrate-to-pressing unit gaps for process control. FIG. 11 shows that the gap control system may be part of a whole system. The gap control system has sensors 904 adjacent to pressing units 901 and 902. The sensors 904 measure gaps between substrate 905 and nearby surfaces of pressing units 901 and 902. The measurements are sent to an electronic control unit 903 to process and generate an appropriate response signal. Unit 903 may include both hardware and software. The response signal is sent to pressing units 901 and 902 to adjust the gaps. Dynamic adjustment of the gaps between the substrate and the pressing units can provide optimum process control.

Figure 12:
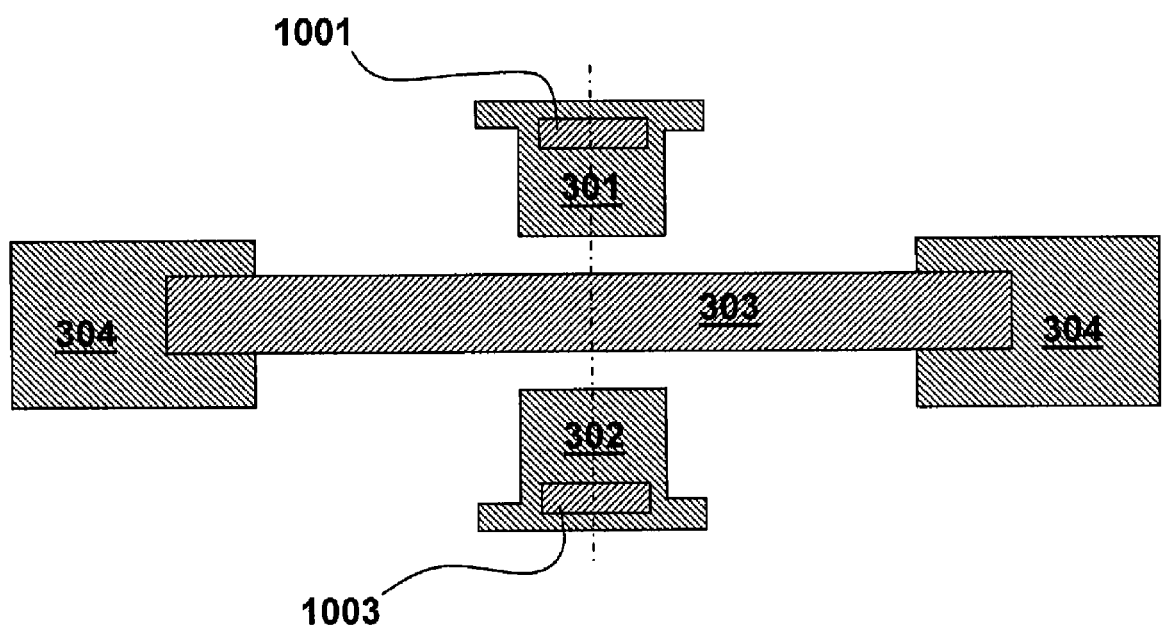
FIG. 12 illustrates an embodiment of apparatus of the invention using magnetic force to press.

Referring to FIG. 12, one embodiment of the apparatus uses magnetic force to press. Pressing units 301 and 302 have magnetic subunits 1001 and 1003 enclosed respectively. The subunits 1001 and 1003 can generate magnetic interactive force among each other without having contact. The magnetic interaction can be turned ON or OFF. It is preferred that the magnetic interaction can be tuned in magnitude and switched between attraction force and rejection force. To generate the magnetic interaction, the subunits can be one of following combinations, but not limited to: (1) one is an electromagnet and the other is a permanent magnetic material or a non-permanent magnetic material; (2) both are electromagnets. An electromagnet can have magnetic interaction ON or OFF by turning ON or OFF of electrical current flowing through its conductor coil. The magnitude of the magnetic interaction can be tuned by controlling the electrical current amplitude. Attraction or rejection of the magnetic interaction can be switched back and forth by switching flowing direction of the electrical current. The magnets may be a regular shape such as circle, square, rectangular, triangular or an irregular shape. A more complex magnetic force generation scheme may also be implemented under the spirit of the embodiment. When the magnetic attraction interaction is established between the subunits, the pressing units connected to the subunits are urged with magnetic forces against each other for pressing of die imprint. Because force and counter-force of an interaction is always the same in magnitude and opposite in direction, the pressing forces applied on the pressing units are precisely balanced to each other. Therefore, the apparatus can perform force-balanced-press for step-and-repeat imprint consistent with the principle of the invention. The magnetic interaction is turned off or switched from attraction force to rejection force to facilitate separating of die imprint. Furthermore, body materials of the pressing unit may be chosen specifically to enhance the magnetic interaction.

Figure 13:
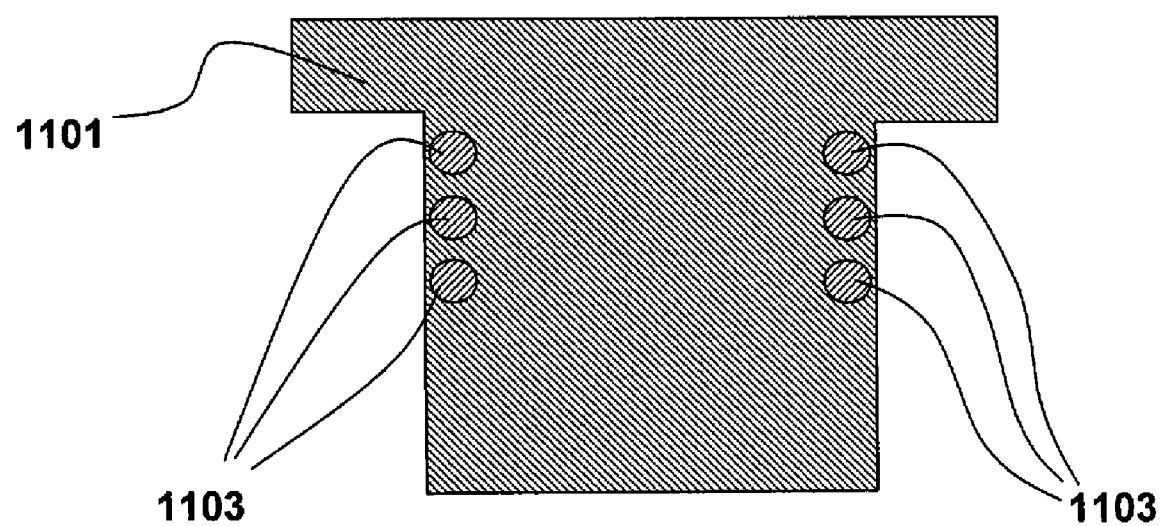
FIG. 13 illustrates an embodiment of pressing unit for the apparatus.

Referring to FIG. 13, a preferred embodiment of the pressing unit for the apparatus of FIG. 12 is disclosed. Subunit 1103 to generate the magnetic interaction is an electromagnet with its conductor coil placed close to or at perimeter of the side surface of pressing unit 1101. The configuration allows space surrounded by the conductor coil that is not blocked or occupied by the subunit. Thus, the pressing unit may achieve transmission of light of ultraviolet, visible or infrared for imaging or exposure or light heating through center area of its body. Such embodiment of the pressing unit may be used for either one or both of top and bottom pressing units.

Figure 14:
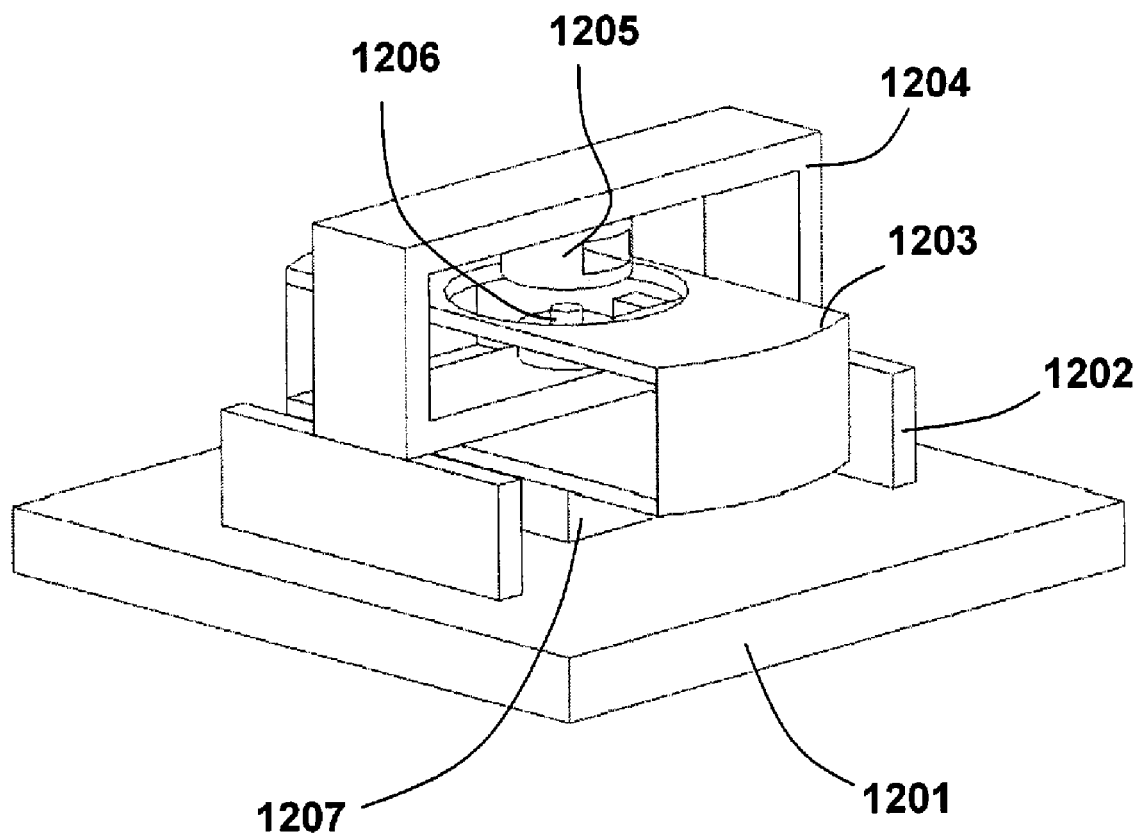
FIG. 14 shows an exemplary setup of apparatus to practice the method of the invention.

FIG. 14 exemplifies an arrangement for step-and-repeat imprint lithography. A base 1201 provides a main frame of the setup. A gantry 1204 has a top pressing unit 1205 and a bottom pressing unit 1206 fixed on inner surfaces of frame beams. Support walls 1202 are provided to raise the gantry up from the base plate. An aligning stage 1207 is disposed between two support walls 1202. A hollow gantry-like fixture 1203 is installed on the aligning stage. The lower beam of gantry 1204 passes through the hollow space of the fixture 1203. On the top surface of the fixture 1203, a hollow circle shows where the substrate should be held. Most area of the substrate is accessible to pressing units 1205 and 1206. Stage 1207 moves the substrate to a new location for next die imprinting when the previous die imprinting is done. The setup can be used to perform step-and-repeat imprint lithography in accordance with the invention.

Figure 15A:
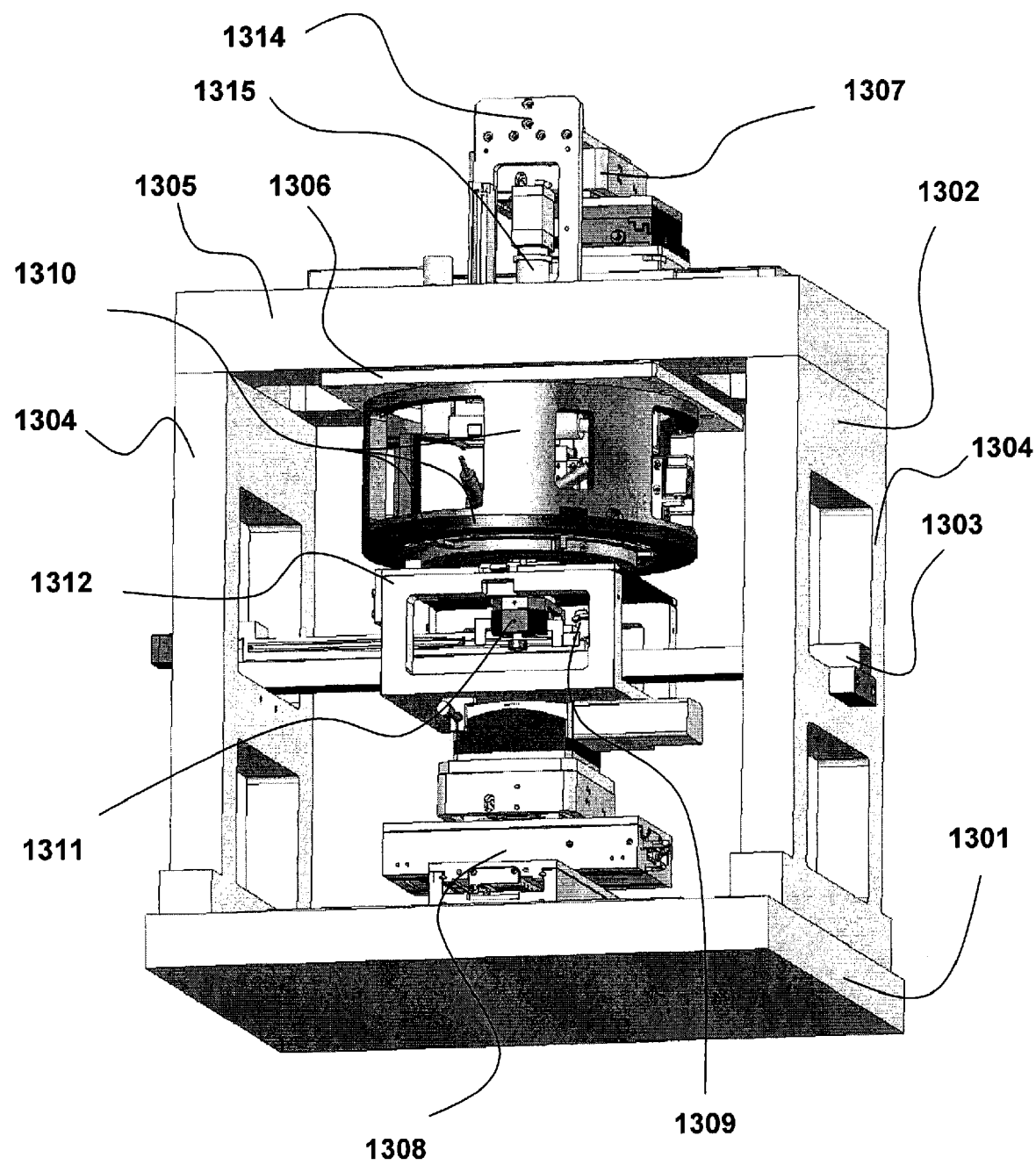
FIGS. 15A, 15B illustrate an embodiment of apparatus to practice the method of the invention.
Figure 15B:
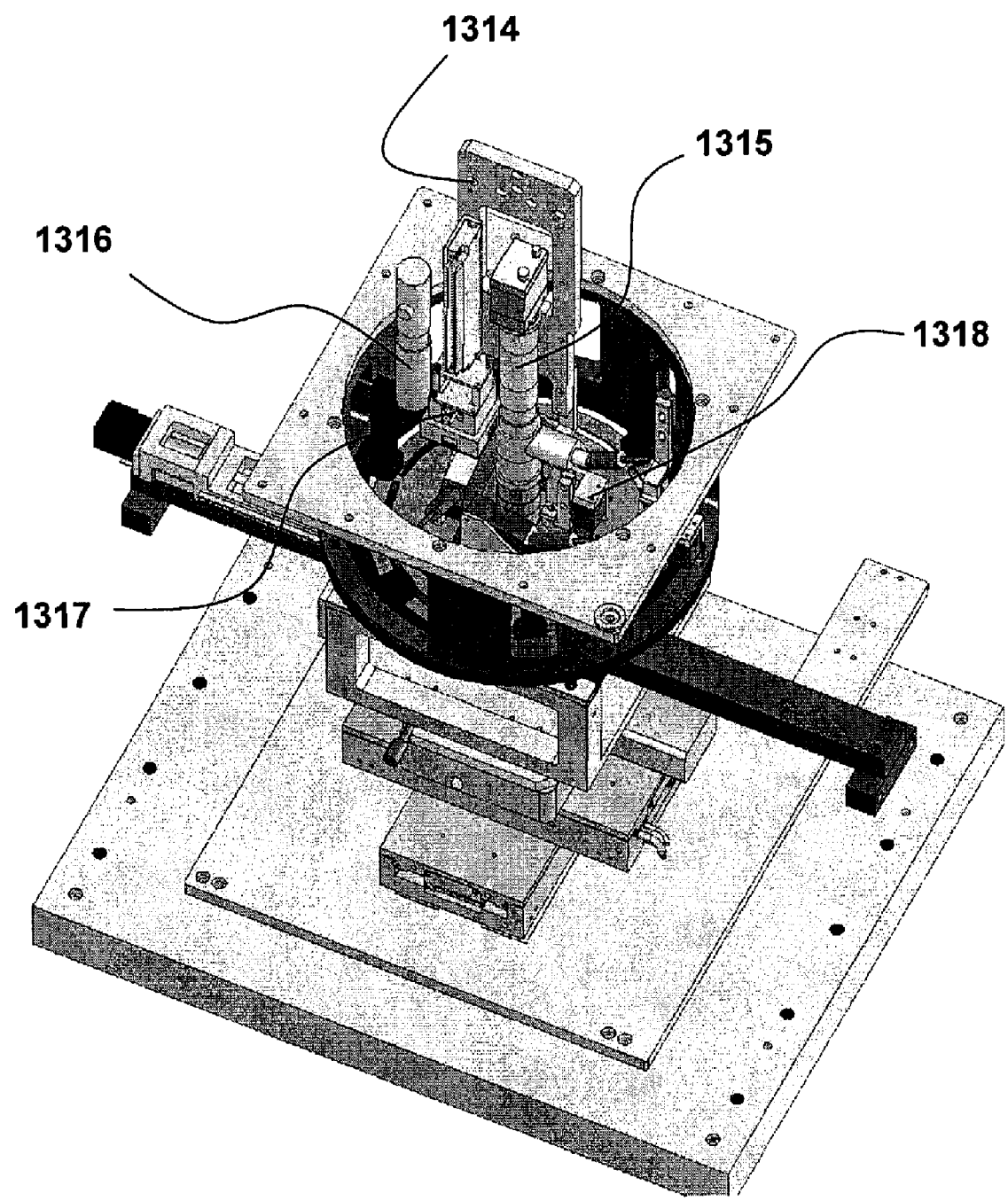

An exemplary embodiment of the apparatus of the invention is illustrated in FIGS. 15A and 15B. Major components of the FIG. 15 embodiment are further illustrated in FIGS. 16, 17 and 18. The embodiment is to perform step-and-repeat imprinting using one side pushing and the other side holding approach illustrated in FIG. 5. In this approach, the pre-pushing gaps between press units and substrate are adjusted to have a predetermined substrate bending. Bending force demanded for bending the substrate is insignificant compared to press force needed for imprinting. Therefore, the two side pressing forces are balanced with a little help from the substrate bending force.

Referring to FIG. 15A, a gantry 1302 is attached to a base plate 1301. A lower beam 1303 connects two side plates 1304 of the gantry at a predetermined height above the base plate. An imprint head assembly 1310 is attached to inner surface of top beam 1305 of the gantry through an adapter plate 1306. Wafer stages 1308 are attached to the base plate and under the lower beam. The wafer stages have two linear motion stages stacked together for X-Y movements. A theta rotation stage stacks on top of the linear motion stages. Finally, a Z motion stage stacks on top of the theta rotation stage. A hollow holder 1312 is attached to the top of the stages. The hollow holder allows the lower beam to pass through and a predetermined X-Y travel range for the stages to move. At middle of the lower beam, an underneath pushing unit 1311 is attached to the beam surface and enclosed by inner space of the hollow holder. The central lines of the imprint head assembly and the underneath pushing unit are coaxial in order to have pushing force and holding force coaxial to each other. A non-contact thermal sensor 1309 is installed to measure substrate temperature from underneath. Microscope stages 1307 is attached to the top surface of the gantry. The microscope stages have X-Y-Z movements. Through a L-shape adapter plate 1314, a single tube microscope 1315 is attached to the microscope stages.

Referring to FIG. 15B, from top view after removing the gantry, more components can be seen inside the imprint head assembly. Microscope 1315 is attached to adapter plate 1314. Left of the microscope, a UV curing lamp 1316 and a thermal heating lamp 1317 are attached to adapter plate 1314. Right of the microscope, a resist dispensing nozzle 1318 is also attached to the adapter plate. The UV curing lamp provides curing exposure for UV resist die imprinting. The thermal heating lamp is used to locally heat die area of the substrate for thermal curable resist die imprinting. The thermal curable resist must have a sufficiently low viscosity in order to be dispensable.

Figure 16:
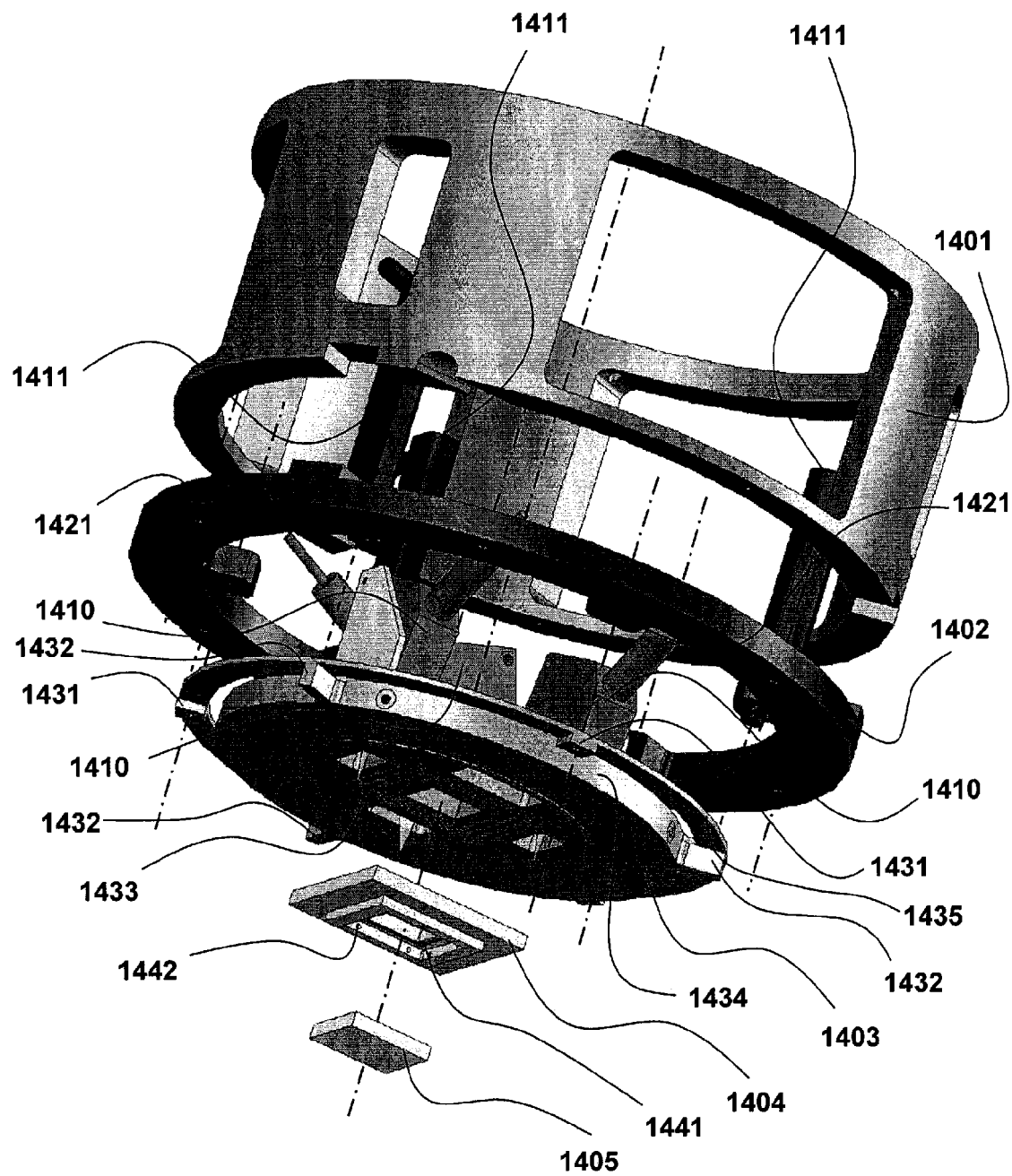
FIG. 16 illustrates an imprint head assembly of the embodiment of apparatus.

FIG. 16 illustrates major components of the imprint head assembly. A support tube 1401 provides structural base for the whole assembly. There are several openings on the sidewall of the support tube to permit a visual check from side. From underneath, a leveling support ring 1402 is attached to the bottom surface of the support tube. Three linear actuators 1411 are attached to three extruded short arms on the leveling support ring. Underneath the leveling support ring, a leveling base plate 1403 has a thick plate body 1434 to provide a rigid support against deformation caused by die-imprinting press. A thin flexible ring-shape wing 1435 surrounds plate body 1434 and connects to the plate body through three extruded arms 1432. The leveling base plate is attached to the leveling support ring at three points (two are seen in the drawing) which are evenly distributed along peripheral of the flexible ring-shape wing. In assembly, the three extruded arms are right beneath the pushing ends of the three linear actuators. Three laser-type distance sensors 1410 are attached to top surface of plate body 1434. The sensors are within the hollow space of the support tube. Three slots are opened through the plate body to allow a laser beam to pass. At center of the plate body, a hole is open to allow the microscope to see through and UV exposure light to pass. The dimensions and shape of the hole correspond to a patterned die area on the template. Vacuum grooves 1433 surround the center hole. The leveling support ring, the leveling base plate and the distance sensors together form an active leveling system that can level the template surface parallel to substrate surface by measuring template/substrate surface gaps at three locations with the sensors, then, adjusting template surface orientation to level template and substrate with pushing or retraction of the actuators. A template adapter 1404 is attached to the leveling base plate by vacuum suction of grooves 1433. The template adapter has a central through hole that is consistent with the central hole of the leveling base plate. An enlarged well is opened to surround the central through hole. A vacuum groove 1441 on bottom step surface of the enlarged well encloses the central through hole. There are mechanical clamps 1442 on inner sidewall of the enlarged well. The dimension of the well is just right to accommodate template 1405. The depth of the well is adjusted to allow the patterned surface of the template to extend out by a predetermined distance. Vacuum groove 1441 and mechanical clamps 1442 are used to firmly attach the template onto the template adapter.

Figure 17:
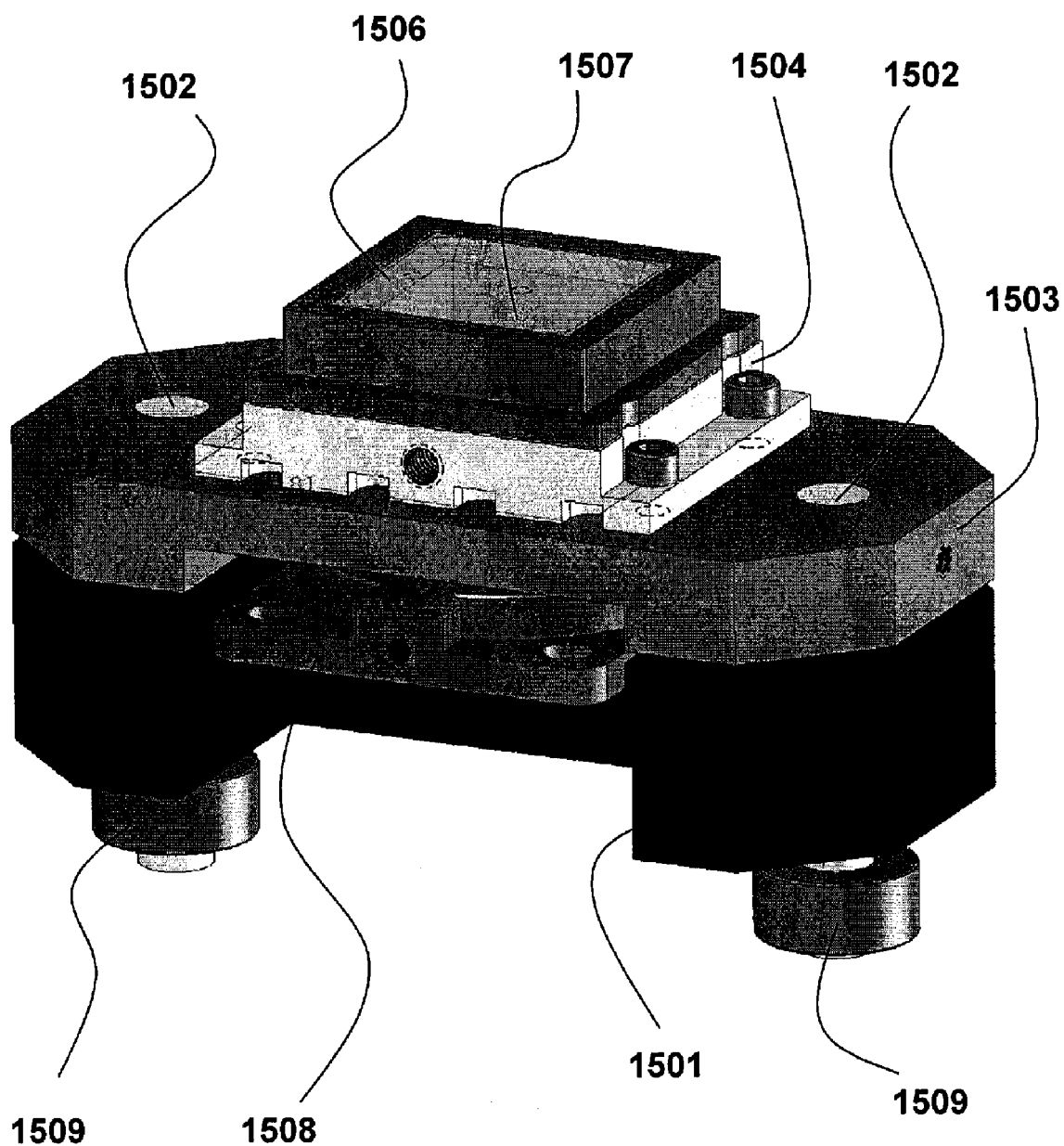
FIG. 17 illustrates an underneath pushing unit of the embodiment of apparatus.

FIG. 17 illustrates the major components of underneath pushing unit 1311. The pushing unit has a base body 1501. An air actuator 1508 is attached to the middle of the base body. Two linear guides 1502 are installed at two corners of the based body. The moving rods of the linear guides are attached to a moving plate 1503 at top end. Two stoppers 1509 are fixed to bottom end of the moving rods to limit maximum travel. An inflatable press unit 1504 is attached in the middle of top surface of the moving plate. The inflatable press unit comprises a membrane 1506 and a cavity 1507 sealed by the membrane. When pressurized fluid is introduced into the cavity, the membrane inflates and presses the substrate from underneath.

Figure 18:
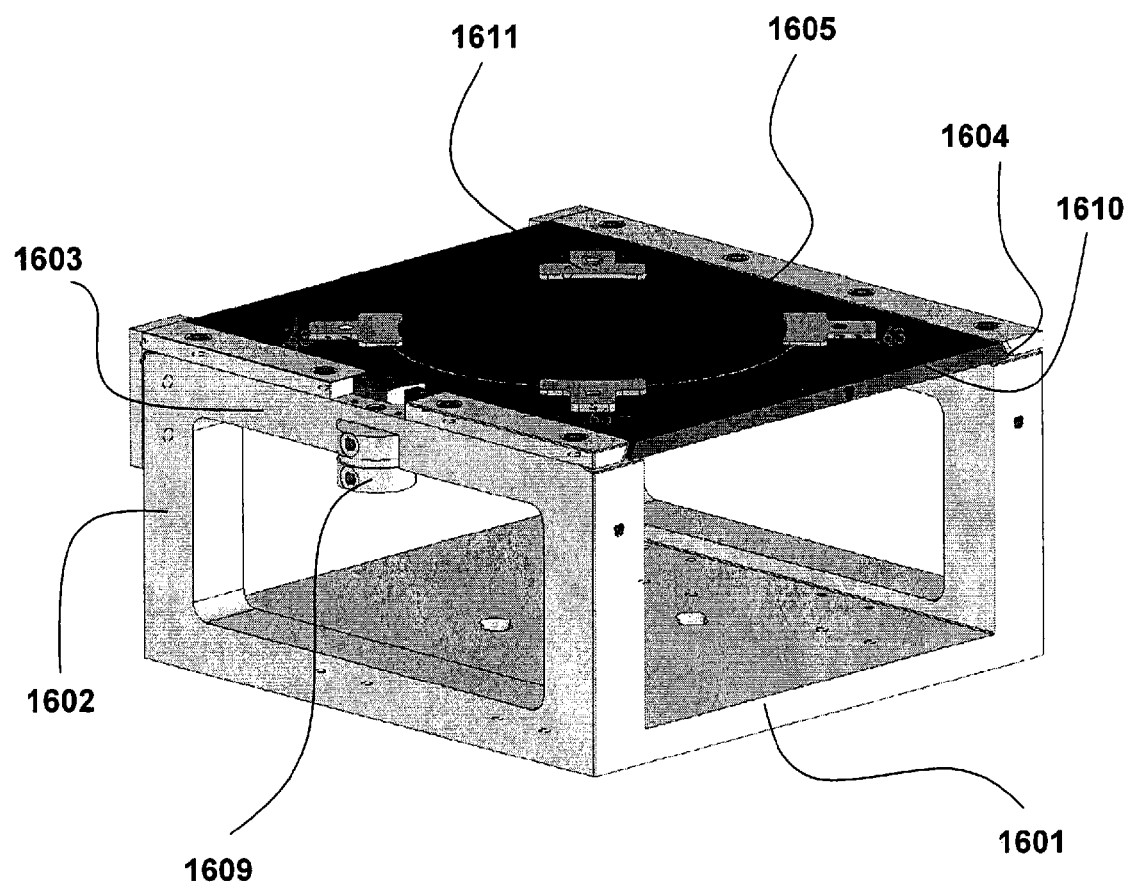
FIG. 18 illustrates a hollow wafer holder of the embodiment of apparatus.

FIG. 18 illustrates an embodiment of hollow holder 1312. Four posts 1602 are attached to a base plate 1601. The four posts provide a predetermined hollowed space for moving the wafer stages. Their height provides a predetermined space required to install the underneath pushing unit. Two horizontal beams 1603 connect top ends of the posts. An air-piston lock 1609 is attached to one of the beam. The beams have V-shape grooves 1604 at their inner sidewalls close to the top surface. A wafer chuck 1610 can slide right into the V-shape grooves and be locked by the air-piston lock. Wafer chuck 1610 has a central hole to allow a wafer or substrate 1605 to be accessible from its both sides. Mechanical clamps 1611 are used to hold the wafer or substrate at edge onto the wafer chuck. Vacuum suction at edge may be used to help holding the wafer or substrate.

It can now be seen that in one aspect, the invention is a method of imprint lithography. The method involves providing a substrate having a moldable surface and a mold having a molding surface. Either the substrate or the mold is supported on a moveable positioner that moves to position the mold and substrate with the molding surface adjacent the moveable surface for imprinting the moldable surface. The molding surface and the moldable are pressed together by opposing substantially transverse forces that are substantially balanced in timing and magnitude to minimize the net transverse force on the supporting positioner and to imprint the moldable surface. The imprinted moldable surface is at least partially hardened to retain the imprint, and the mold and the substrate are separated. Advantageously, the molding surface is smaller in lateral areas than the substrate and the positioner moves the mold or substrate to a new position where a new region of the moldable surface is imprinted.

In another aspect, the invention is apparatus for performing step-and-repeat imprint lithography on a substrate having a moldable surface. The apparatus comprises, in operative relationship, a mold having a molding surface for imprinting the moldable surface, a moveable positioner for positioning the substrate or mold with the molding surface adjacent the moldable surface for imprinting a lateral region of the moldable surface, and a pair of moveable fixtures for pressing together the mold and the substrate with the mold or substrate on the positioner by opposing transverse forces that are substantially balanced in magnitude and time to minimize the net transverse force on the positioner. Advantageously the sequence of positioning and balanced pressing is controlled by an automatic controller. The controller can sequentially move the mold on the substrate to imprint respectively different positions on the substrate.

It is to be understood that the above described embodiments are illustrative of only a few of the many embodiments that can represent applications of the invention. Numerous and varied other arrangements can be made by those skilled in the art without departing from the spirit and scope of the invention.

The invention claimed is:

1. A method of imprint lithography to provide step-and-repeat imprint replication on a moldable surface of a substrate of a pattern having microscale or nanoscale features comprising the steps of:
   a). providing the substrate having the moldable surface;
   b). providing the mold having a molding surface that is for molding the pattern, the molding surface smaller in lateral area than said substrate;
   c). providing a body facing said molding surface of said mold;
   d). disposing said substrate in a laterally movable positioner between said mold and said body wherein said moldable surface faces said molding surface;
   e). pressing both sides of said substrate at opposing locations with said mold and said body by opposing transverse forces that are balanced;
   f). at least partially hardening the moldable surface;
   g). removing said mold and said body from said substrate;
   h). laterally moving said movable positioner and said substrate relative to said mold and said body; and
   i). repeating step e to step g at least once.

2. The method of claim 1 wherein said substrate further comprises an additional moldable surface on the side opposite to said moldable surface.

3. The method of claim 1 wherein said body is a mold having a molding surface.

4. The method of claim 1 wherein said pressing comprises the steps of:
   j). disposing said mold and said body to contact with said substrate;
   k). pressing said substrate by balancing said opposing transverse forces to reduce the net transverse force; and
   l). retaining force balance during removal of the mold and the body from the substrate.

5. The method of claim 1 further comprising the step of releasing said pressing.

6. The method of claim 5 wherein said releasing comprises reducing said opposing transverse forces while balancing them.

7. The method of claim 1 wherein said removing said mold and said body from said substrate comprises separating said molding surface and said moldable surface.

* * * * *